United States Patent
Takami et al.

(10) Patent No.: US 9,567,665 B2
(45) Date of Patent: Feb. 14, 2017

(54) SPUTTERING TARGET FOR MAGNETIC RECORDING FILM, AND PROCESS FOR PRODUCING SAME

(75) Inventors: Hideo Takami, Ibaraki (JP); Atsushi Nara, Ibaraki (JP); Shin-ichi Ogino, Ibaraki (JP)

(73) Assignee: JX Nippon Mining & Metals Corporation, Tokyo (JP)

(\*) Notice: Subject to any disclaimer, the term of this patent is extended or adjusted under 35 U.S.C. 154(b) by 861 days.

(21) Appl. No.: 13/808,172

(22) PCT Filed: Feb. 2, 2011

(86) PCT No.: PCT/JP2011/052125
§ 371 (c)(1),
(2), (4) Date: Jan. 3, 2013

(87) PCT Pub. No.: WO2012/014504
PCT Pub. Date: Feb. 2, 2012

(65) Prior Publication Data
US 2013/0098760 A1  Apr. 25, 2013

(30) Foreign Application Priority Data

Jul. 29, 2010 (JP) ................. 2010-171038
Dec. 20, 2010 (JP) ................. 2010-283678

(51) Int. Cl.
C23C 14/35 (2006.01)
C23C 14/14 (2006.01)
(Continued)

(52) U.S. Cl.
CPC ........... *C23C 14/14* (2013.01); *C23C 14/0617* (2013.01); *C23C 14/0688* (2013.01);
(Continued)

(58) Field of Classification Search
CPC .. H01J 37/3426; C23C 14/0617; C23C 14/14; C23C 14/083
See application file for complete search history.

(56) References Cited

U.S. PATENT DOCUMENTS 5,441,804 A * 8/1995 Akitake ............... C23C 14/14
  204/192.2
5,989,728 A * 11/1999 Coffey ................. G11B 5/00
  204/192.2
(Continued)

FOREIGN PATENT DOCUMENTS

CN  101195882 A  6/2008
JP  H03-116526 A  5/1991
(Continued)

*Primary Examiner* — Jason M Berman
(74) *Attorney, Agent, or Firm* — Howson & Howson, LLP

(57) ABSTRACT

Provided is a sputtering target containing $SiO_2$ for a magnetic recording film, wherein a ratio of the peak intensity of cristobalites, which are crystallized $SiO_2$, to the background intensity (cristobalite peak intensity/background intensity) in an X-ray diffraction is 1.40 or less. The present invention aims to obtain a sputtering target for a magnetic recording film capable of inhibiting the formation of cristobalites in the target which cause the generation of particles during sputtering, and shortening the burn-in time.

16 Claims, 3 Drawing Sheets

(51) Int. Cl.
  *C23C 14/08* (2006.01)
  *H01J 37/34* (2006.01)
  *C23C 14/06* (2006.01)
  *C23C 14/34* (2006.01)
  *G11B 5/851* (2006.01)

(52) U.S. Cl.
  CPC ........ *C23C 14/083* (2013.01); *C23C 14/3414* (2013.01); *G11B 5/851* (2013.01); *H01J 37/3426* (2013.01)

(56) References Cited

U.S. PATENT DOCUMENTS

| | | | |
|---|---|---|---|
| 6,716,542 B2 | 4/2004 | Uwazumi et al. | |
| 7,381,282 B2 | 6/2008 | Ueno et al. | |
| 7,645,363 B2 | 1/2010 | Ichihara et al. | |
| 8,568,576 B2 | 10/2013 | Sato | |
| 8,679,268 B2 | 3/2014 | Ogino et al. | |
| 8,932,444 B2 | 1/2015 | Sato | |
| 8,936,707 B2 | 1/2015 | Sato | |
| 9,034,153 B2 | 5/2015 | Satoh | |
| 9,034,155 B2 | 5/2015 | Sato et al. | |
| 2006/0249371 A1* | 11/2006 | Ichihara | G11B 5/65 204/192.2 |
| 2007/0187236 A1 | 8/2007 | Nakamura et al. | |
| 2007/0189916 A1 | 8/2007 | Zhang | |
| 2010/0270146 A1 | 10/2010 | Nonaka et al. | |
| 2011/0247930 A1 | 10/2011 | Sato | |
| 2012/0118734 A1 | 5/2012 | Sato et al. | |
| 2012/0241317 A1 | 9/2012 | Ikeda et al. | |
| 2013/0112555 A1 | 5/2013 | Ogino et al. | |
| 2013/0134038 A1 | 5/2013 | Sato et al. | |
| 2013/0168240 A1 | 7/2013 | Ogino et al. | |
| 2013/0175167 A1 | 7/2013 | Ikeda et al. | |
| 2013/0206591 A1 | 8/2013 | Takami et al. | |
| 2013/0213802 A1 | 8/2013 | Sato et al. | |
| 2013/0213804 A1 | 8/2013 | Arakawa et al. | |
| 2013/0220804 A1 | 8/2013 | Arakawa et al. | |
| 2013/0248362 A1 | 9/2013 | Ogino et al. | |
| 2013/0292245 A1 | 11/2013 | Ikeda et al. | |
| 2013/0306470 A1 | 11/2013 | Ogino et al. | |
| 2014/0001038 A1 | 1/2014 | Ogino et al. | |
| 2014/0311902 A1 | 10/2014 | Ogino et al. | |
| 2014/0346039 A1 | 11/2014 | Ogino | |
| 2014/0367254 A1 | 12/2014 | Sato et al. | |
| 2015/0021175 A1 | 1/2015 | Arakawa et al. | |
| 2015/0107991 A1 | 4/2015 | Sato | |
| 2015/0170890 A1 | 6/2015 | Ikeda | |

FOREIGN PATENT DOCUMENTS

| | | |
|---|---|---|
| JP | 07-098835 A | 4/1995 |
| JP | 10-088333 A | 4/1998 |
| JP | 10-158097 A | 6/1998 |
| JP | 2000-178726 A | 6/2000 |
| JP | 2003-313659 A | 11/2003 |
| JP | 2006-045587 A | 2/2006 |
| JP | 2006-176808 A | 7/2006 |
| JP | 2007-031808 A | 2/2007 |
| JP | 2008-162849 A | 7/2008 |
| JP | 2008-179900 A | 8/2008 |
| JP | 2009-001861 A | 1/2009 |
| JP | 2009-080348 A | 4/2009 |

* cited by examiner

XRD Measurement Result

SPUTTERING TARGET FOR MAGNETIC RECORDING FILM, AND PROCESS FOR PRODUCING SAME

BACKGROUND

The present invention relates to a sputtering target for a magnetic recording film, which is used in the deposition of a magnetic thin film of a magnetic recording medium, and particularly a magnetic recording layer of a hard disk adopting the perpendicular magnetic recording system; and to a sputtering target capable of inhibiting the formation of cristobalites that cause the generation of particles during sputtering, and shortening the time required from the start of sputtering to deposition (hereinafter referred to as the "burn-in time").

In the field of magnetic recording as represented with hard disk drives, a material based on Co, Fe or Ni as ferromagnetic metals is used as the material of the magnetic thin film being responsible for the recording. For example, Co—Cr-based or Co—Cr—Pt-based ferromagnetic alloys having Co as its main component are used for the recording layer of hard disks adopting the longitudinal magnetic recording system.

Moreover, composite materials of a Co—Cr—Pt-based ferromagnetic alloy having Co as its main component and a nonmagnetic inorganic material are often used for the recording layer of hard disks adopting the perpendicular magnetic recording system which was recently put into practical application.

A magnetic thin film of a magnetic recording medium such as a hard disk is often produced by sputtering a target of ferromagnetic material having the foregoing materials as its components in light of its high productivity. Moreover, $SiO_2$ is sometimes added to such a sputtering target for a magnetic recording film in order to magnetically separate the alloy phase.

As a method of manufacturing a ferromagnetic sputtering target, the melting method or powder metallurgy may be considered. It is not necessarily appropriate to suggest which method is better since it will depend on the demanded characteristics, but a sputtering target composed of ferromagnetic alloys and nonmagnetic inorganic grains, which is used for forming the recording layer of hard disks based on the perpendicular magnetic recording system, is generally manufactured with powder metallurgy. This is because the inorganic grains such as $SiO_2$ need to be uniformly dispersed within the alloy basis material and this is difficult to achieve with the melting method.

For example, proposed is a method of: mechanically-alloying an alloy powder having an alloy phase prepared by the rapid solidification method, and a powder configuring the ceramic phase, so that the powder configuring the ceramic phase is to be uniformly dispersed within the alloy powder; and performing hot press molding thereto in order to obtain a sputtering target for use in a magnetic recording medium (Patent Document 1).

The target structure in the foregoing case appears to be such that the base metal is bonded in a milt (cod roe) shape and surrounded with $SiO_2$ (ceramics) (FIG. 2 of Patent Document 1), or $SiO_2$ is dispersed in a thin string shape (FIG. 3 of Patent Document 1). While it is blurred in the other diagrams, the target structure in such other diagrams is also assumed to be of the same structure. This kind of structure entails the problems described later, and it cannot be said that this kind of structure is a preferred sputtering target for a magnetic recording medium. Note that the spherical substance shown in FIG. 4 of Patent Document 1 is mechanical alloying powder, and is not a structure of the target.

Moreover, without using the alloy powder prepared by the rapid solidification method, it is also possible to produce a ferromagnetic sputtering target by preparing commercially available raw powders for the respective components configuring the target, weighing these raw powders to achieve the intended composition, mixing the raw powders with a known method such as ball milling, and molding and sintering the mixed powder via hot press.

There are various types of sputtering devices, but a magnetron sputtering device comprising a DC power source is broadly used in light of its high productivity for the deposition of the foregoing magnetic recording films. This sputtering method is to place a positive-electrode substrate and a negative-electrode target opposite each other, and generate an electric field by applying high voltage between the substrate and the target under an inert gas atmosphere.

Here, inert gas is ionized, plasma composed of electrons and positive ions is formed, the positive ions in the plasma collide with the target (negative electrode) surface to discharge the constituent atoms of the target, and the extruded atoms adhere to the opposing substrate surface to form a film. The sputtering method employs a principle where the material configuring the target is deposited on the substrate as a result of performing the sequential process described above.

As described above, the sputtering target for a magnetic recording film is sometimes doped with $SiO_2$ in order to magnetically separate the alloy phase. When $SiO_2$ is added to the magnetic metal material, there is a problem in that micro cracks are generated in the target and the generation of particles during sputtering increases.

Moreover, with a $SiO_2$-doped magnetic material target, there is an additional drawback in that the burn-in time becomes longer in comparison to a magnetic material target that is not doped with $SiO_2$.

While there was some debate as to whether this was due to problems related to the $SiO_2$ itself, or due to the transformation of $SiO_2$, or due to problems related to the interaction with other magnetic metals or additive materials; the fundamental cause had not been clarified. In most cases, the foregoing problems were considered inevitable and were quietly condoned or overlooked. Nevertheless, it is necessary to maintain the characteristics of magnetic films at a high level based on current demands, and the further characteristic improvement of sputtered film is being demanded.

With conventional technologies, certain documents describe the technique of adding $SiO_2$ to a sputtering target using a magnetic material. Patent Document 2 discloses a target including a metal phase as a matrix, a ceramic phase that is dispersed in the matrix phase, and an interfacial reaction phase between the metal phase and the ceramic phase, wherein the relative density is 99% or more. While $SiO_2$ is included as an option as the ceramic phase, Patent Document 2 has no recognition of the foregoing problems and fails to propose any solution to such problems.

Patent Document 3 proposes, upon producing a CoCrPt—$SiO_2$ sputtering target, calcining Pt powder and $SiO_2$ powder, mixing Cr powder and Co powder to the obtained calcined powder, and performing pressure sintering thereof. Nevertheless, Patent Document 3 has no recognition of the foregoing problems and fails to propose any solution to such problems.

Patent Document 4 discloses a sputtering target including a metal phase containing Co, a ceramic phase having a grain size of 10 μm or less, and an interfacial reaction phase between the metal phase and the ceramic phase, wherein the ceramic phase is scattered in the metal phase; and proposes that $SiO_2$ is included as an option as the ceramic phase. Nevertheless, Patent Document 4 has no recognition of the foregoing problems and fails to propose any solution to such problems.

Patent Document 5 proposes a sputtering target containing non-magnetic oxide in an amount of 0.5 to 15 mol, Cr in an amount of 4 to 20 mol, Pt in an amount of 5 to 25 mol, B in an amount of 0.5 to 8 mol, and remainder being Co. While $SiO_2$ is included as an option as the non-magnetic oxide, Patent Document 5 has no recognition of the foregoing problems and fails to propose any solution to such problems.

Note that Patent Document 6 is also listed as a reference, and this document discloses technology of producing cristobalite grains as filler of sealants for semiconductor elements such as memories. While Patent Document 6 is technology that is unrelated to a sputtering target, it relates to $SiO_2$ cristobalites.

Patent Document 7 relates to a carrier core material for use as a electrophotographic developer. While Patent Document 7 is technology that is unrelated to a sputtering target, it relates to the types of crystals related to $SiO_2$. One type is $SiO_2$ quartz crystals, and the other type is cristobalite crystals.

While Patent Document 8 is technology that is unrelated to a sputtering target, it explains that cristobalite is a material that impairs the oxidative protection function of silicon carbide.

Patent Document 9 describes a sputtering target for forming a protection film of an optical recording medium having a structure where patternless $SiO_2$ is dispersed in the zinc chalcogenide base metal. Here, the transverse rupture strength of the target comprising zinc chalcogenide-$SiO_2$ and the generation of cracks during sputtering with such target are affected by the form and shape of $SiO_2$, and Patent Document 9 discloses that when the $SiO_2$ is patternless (amorphous), the target will not crack during sputtering, even with high-power sputtering.

While this is a suggestion in some ways, Patent Document 9 consistently relates to a sputtering target, using zinc chalcogenide, for forming a protection film of an optical recording medium, and it is totally unknown as to whether it can resolve the problems of a magnetic material having a different matrix material.

[Patent Document 1] Japanese Laid-Open Patent Publication No. H10-88333
[Patent Document 2] Japanese Laid-Open Patent Publication No. 2006-45587
[Patent Document 3] Japanese Laid-Open Patent Publication No. 2006-176808
[Patent Document 4] Japanese Laid-Open Patent Publication No. 2008-179900
[Patent Document 5] Japanese Laid-Open Patent Publication No. 2009-1861
[Patent Document 6] Japanese Laid-Open Patent Publication No. 2008-162849
[Patent Document 7] Japanese Laid-Open Patent Publication No. 2009-80348
[Patent Document 8] Japanese Laid-Open Patent Publication No. H10-158097
[Patent Document 9] Japanese Laid-Open Patent Publication No. 2000-178726

SUMMARY OF INVENTION

Problems to be Solved by the Invention

A compound material composed of ferromagnetic alloy and non-magnetic inorganic material is often used in a sputtering target for a magnetic recording film, and $SiO_2$ is sometimes added as the inorganic material. An object of this invention is to inhibit the generation of particles during sputtering and shorten the burn-in time as to a $SiO_2$-doped sputtering target for a magnetic recording film.

Means for Solving the Problems

As a result of intense study to achieve the foregoing object, the present inventors discovered that it is possible to inhibit the formation of cristobalite that cause the generation of particles during sputtering by devising the addition of $SiO_2$ to the sputtering target for a magnetic recording film. Specifically, it was found that it is possible to inhibit micro cracks in the target and the generation of particles during sputtering, as well as shorten the burn-in time.

Based on the foregoing discovery, the present invention provides:
1) A sputtering target containing $SiO_2$ for a magnetic recording film, wherein a ratio of the peak intensity of cristobalites, which are crystallized $SiO_2$, to the background intensity (cristobalite peak intensity/background intensity) in an X-ray diffraction is 1.40 or less.
2) The sputtering target containing $SiO_2$ for a magnetic recording film according to 1) above, wherein a rate of change of the thermal expansion coefficient during temperature rising from 250° C. to 350° C. is 7% or less.

There is no particular limitation regarding the material of magnetic recording film to be formed with the $SiO_2$-containing sputtering target, and the present invention may be applied to various types of magnetic recording materials. The present invention is particularly effective for the targets composed of the following materials for a magnetic recording film. In other words, the present invention provides the targets of following 3), 4), and 5).
3) The sputtering target for a magnetic recording film according to 1) or 2) above, wherein Cr is contained in an amount of 50 mol % or less, $SiO_2$ is contained in an amount of 20 mol % or less, and the remainder is Co.
4) The sputtering target for a magnetic recording film according to 1) or 2) above, wherein Cr is contained in an amount of 50 mol % or less, Pt is contained in an amount of 50 mol % or less, $SiO_2$ is contained in an amount of 20 mol % or less, and the remainder is Co.
5) The sputtering target for a magnetic recording film according to 1) or 2) above, wherein Pt is contained in an amount of 5 mol % or more and 60 mol % or less, $SiO_2$ is contained in an amount of 20 mol % or less, and the remainder is Fe.
6) The present invention additionally provides the sputtering target for a magnetic recording film according to any one of 1) to 5) above, wherein one or more elements selected from B, Ti, V, Mn, Zr, Nb, Ru, Mo, Ta, W, Au, Cu, and Ag is contained as an additive element in an amount of 0.01 mol % or more and 10 mol % or less.
7) The present invention further provides the sputtering target for a magnetic recording film according to any one of 1) to 6) above, wherein one or more inorganic materials selected from carbon, oxide other than $SiO_2$, nitride, and carbide is contained as an additive material.

8) The present invention also provides a method of producing the sputtering target for a magnetic recording film according to any one of 1) to 7) above, wherein amorphous $SiO_2$ is used as a powder raw material of $SiO_2$, the powder raw material of $SiO_2$ and magnetic metal powder raw materials are mixed, and subject to sintering at a sintering temperature of 1120° C. or less.

The sputtering target for a magnetic recording film of the present invention adjusted as described above yields superior effects of being able to inhibit the generation of micro cracks in a target, inhibit the generation of particles during sputtering, and shorten the burn-in time. Since particles are less-frequently generated, a significant effect is yielded in that the percent defective of the magnetic recording film is reduced and cost reduction can be realized. Moreover, shortening of the burn-in time significantly contributes to the improvement of production efficiency.

DETAILED DESCRIPTION

Figure 1:
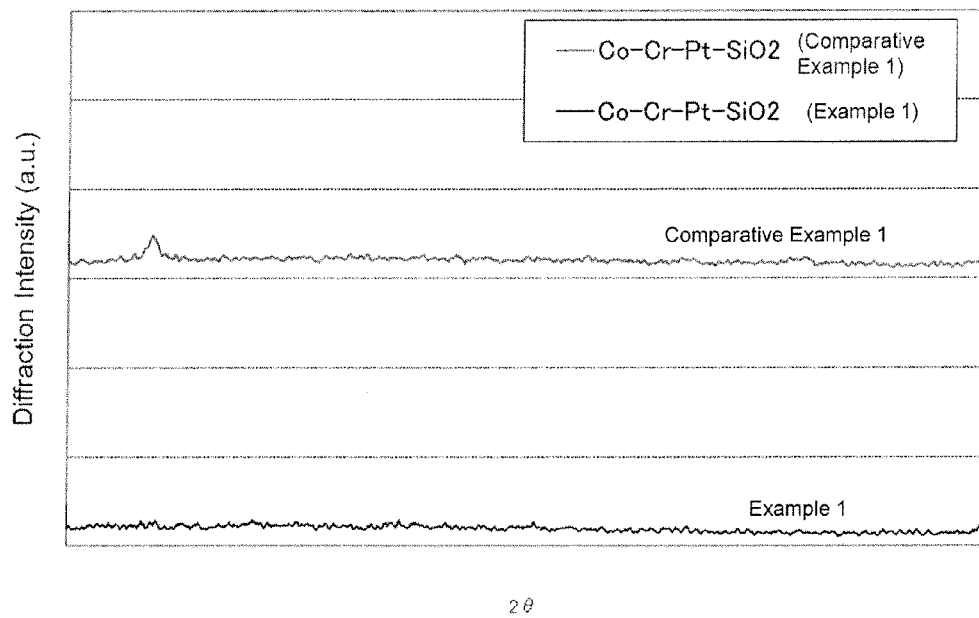
FIG. 1 This is a diagram showing the measurement results of the X-ray diffraction intensity of the Co—Cr—Pt—$SiO_2$ targets of Example 1 and Comparative Example 1.

The sputtering target of the present invention is a sputtering target containing $SiO_2$ for a magnetic recording film, wherein a peak intensity ratio of cristobalites, which are crystallized $SiO_2$, (cristobalite peak intensity/background intensity) is 1.40 or less. In other words, the present invention is a sputtering target for a magnetic recording film from which cristobalites that are crystallized $SiO_2$ were completely eliminated, or reduced as much as possible.

A compound material composed of ferromagnetic alloy and non-magnetic inorganic material is often used in a sputtering target for a magnetic recording film, and $SiO_2$ is sometimes added as the inorganic material.

Nevertheless, when the $SiO_2$ crystallizes in the target and exists as cristobalites, a volume change associated with phase transition occurs during a heating or cooling process of the target (this temperature is roughly 270° C.), and this volume change causes the generation of micro cracks in the target.

The foregoing micro cracks consequently cause the generation of particles during sputtering. Accordingly, it would be effective for the $SiO_2$ to exist as amorphous $SiO_2$ in the target than becoming crystallized and existing as cristobalites.

As described above, while there is no particular limitation in the magnetic material for the sputtering target for a magnetic recording film; those being useful are: a sputtering target for a magnetic recording film containing Cr in an amount of 50 mol % or less, $SiO_2$ in an amount of 20 mol % or less, and remainder being Co; a sputtering target for a magnetic recording film containing Cr in an amount of 50 mol % or less, Pt in an amount of 50 mol % or less, $SiO_2$ in an amount of 20 mol % or less, and remainder being Co; and a sputtering target for a magnetic recording film containing Pt in an amount of 5 mol % or more and 60 mol % or less, $SiO_2$ in an amount of 20 mol % or less, and remainder being Fe.

These are necessary components for the magnetic recording medium. While the blending ratio may vary within the foregoing range, any of the variations enables to maintain characteristics as an effective magnetic recording medium.

Also in the foregoing cases, the $SiO_2$ needs to exist as amorphous $SiO_2$ in the target without becoming crystallized and existing as cristobalites.

Note that when Cr described above is to be added as an essential component, the amount excludes 0 mol %. In other words, the amount of Cr to be contained needs to be at least an analyzable lower limit or higher. If the Cr amount is 50 mol % or less, an effect can be yielded even in cases where trace amounts are added. The present invention covers all of the foregoing variations. This is a necessary component for a magnetic recording medium. While the blending ratio may vary within the foregoing range, any of the variations enables to maintain the characteristics as an effective magnetic recording medium.

Similarly, when Pt described above is to be added as an essential component, the amount excludes 0 mol %. In other words, the amount of Pt to be contained needs to be at least an analyzable lower limit or higher. If the Pt amount is 50 mol % or less, an effect can be yielded even in cases where trace amounts are added. The present invention covers all of the foregoing variations. This is a necessary component for a magnetic recording medium. While the blending ratio may vary within the foregoing range, any of the variations enables to maintain the characteristics as an effective magnetic recording medium.

In addition, also effective is the foregoing sputtering target for a magnetic recording film containing, as an additive element, one or more elements selected from B, Ti, V, Mn, Zr, Nb, Ru, Mo, Ta, W, Au, Cu, and Ag in an amount of 0.01 mol % or more and 10 mol % or less. The additive element is an element that is added as needed in order to improve the characteristics as a magnetic recording medium. Furthermore, also effective is the foregoing sputtering target for a magnetic recording film containing, as an additive element, one or more inorganic materials selected from carbon, oxide other than $SiO_2$, nitride, and carbide.

Accordingly, the present invention can be applied to various alloy systems containing $SiO_2$; for instance, Co—Pt—$SiO_2$—X, Co—Cr—Pt—$SiO_2$—X, Co—Cr—$SiO_2$—X, and Fe—Pt—$SiO_2$—X.

Upon producing this kind of sputtering target for a magnetic recording film, it is effective to use amorphous $SiO_2$ as a powder raw material of $SiO_2$, and achieve the amorphization of the raw material itself. Subsequently, the powder raw material of $SiO_2$ and magnetic metal powder raw materials are mixed, and subject to sintering at a sintering temperature of 1120° C. or less. This low sintering temperature is effective for inhibiting the crystallization of the $SiO_2$. Moreover, as a result of using high-purity $SiO_2$, it is further possible to inhibit crystallization. In this respect, it is desirable to use high purity $SiO_2$ having a purity level of 4N or more, preferably 5N or more.

While the production method is now explained in detail, this production method is merely a representative and preferred example. In other words, the present invention is not limited to the following production method, and it should be easy to understanding that other production methods may also be adopted so as long as they are able to achieve the object and conditions of the present invention.

The ferromagnetic sputtering target of the present invention can be manufactured with powder metallurgy. Foremost, the powder raw materials (magnetic metal powders) of the respective metal elements and the $SiO_2$ powder raw material are prepared, and the powder raw materials of the additive metal elements are prepared as needed. Desirably, the maximum grain size of these powders is 20 μm or less.

Moreover, the alloy powders of these metals may be prepared in substitute for the powders of the respective metal elements, and it is desirable that the maximum grain size is also 20 μm or less in the foregoing case.

Meanwhile, if the grain size is too small, there is a problem in that oxidation is promoted and the component composition will not fall within the intended range. Thus, it is further desirable that the grain size is 0.1 μm or more.

Subsequently, these metal powders are weighed to obtain the intended composition, and subject to pulverizing and mixing with well-known methods by ball milling or the like. If inorganic powder is to be added, it should be added to the metal powders at this stage.

Carbon powder, oxide powder other than $SiO_2$, nitride powder or carbide powder is prepared as the inorganic powder, and it is desirable that the maximum grain size of the inorganic powder is 5 μm or less. Meanwhile, if the grain size is too small, the powders become agglomerated, and the grain size is therefore desirably 0.1 μm or more.

Moreover, a planetary-screw mixer or a planetary-screw agitator/mixer is preferably used as the mixer. In addition, mixing is preferably performed in an inert gas atmosphere or a vacuum in consideration of the problem of oxidation during the mixing process.

By molding and sintering the powder obtained as described above using a vacuum hot press device, and this sintered compact is cut into an intended shape to obtain the ferromagnetic sputtering target of the present invention. Here, as described above, sintering is performed at a sintering temperature of 1120° C. or less.

This low sintering temperature is a temperature that is required for inhibiting the crystallization of $SiO_2$.

Moreover, the molding and sintering processes are not limited to the hot press method, and a plasma discharge sintering method or a hot isostatic sintering method may also be used. The holding temperature during the sintering process is preferably set to the lowest temperature within the temperature range in which the target can be sufficiently densified. Although this will depend on the composition of the target, in many cases a temperature range of 900 to 1120° C. is preferable.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

In Example 1, Co powder having an average grain size of 3 μm, Cr powder having an average grain size of 5 μm, Pt powder having an average grain size of 1 μm, and amorphous $SiO_2$ powder having an average grain size of 1 μm were prepared as the raw powders. The foregoing powders were weighed at a weight percentage as follows; that is, 70.76 wt % of Co powder, 9.6 wt % of Cr powder, 15.01 wt % of Pt powder, and 4.62 wt % of $SiO_2$ powder; to achieve a target composition of 78Co-12Cr-5Pt-5$SiO_2$ (mol %).

Subsequently, the Co powder, Cr powder, Pt powder and $SiO_2$ powder were placed, together with zirconia balls as the grinding medium, in a ball mill pot with a capacity of 10 liters, and it was rotated for 20 hours to mix the raw powders.

This mixed powder was filled in a carbon mold, and hot pressed in a vacuum atmosphere under the following conditions; namely, temperature of 1100° C. (temperature was set to be 1120° C. or less to avoid the crystallization of the $SiO_2$ powder), holding time of 3 hours, and pressure of 30 MPa; to obtain a sintered compact. This sintered compact was cut with a lathe to obtain a disk-shaped target having a diameter of 180 mm and thickness of 7 mm.

The peak intensity of cristobalites was measured by cutting out a piece from the target and subjecting it to measurement of the X-ray diffraction intensity via the X-ray diffraction (XRD) method. Consequently, the peak intensity appearing at 2θ:21.98° was 35. The background intensity, ((average value of intensity at 20.5 to 21.5°)+(average value of intensity at 22.5 to 23.5°))÷2, was also measured. The ratio of the peak intensity of cristobalites, which are crystallized $SiO_2$, to the background intensity (cristobalite peak intensity/background intensity) was 1.26.

These results are shown as a lower line in the XRD measurement results of FIG. 1. The $SiO_2$ raw material was amorphous, and the peak of cristobalites did not appear at 2θ:21.98° in the sintered target. As a comparison, the X-ray diffraction intensity of Comparative Example 1 is shown as an upper line in FIG. 1, but a peak of cristobalites appeared at 2θ:21.98°. As to the following Examples and Comparative Examples, the results were the same as shown in FIG. 1.

Note that Ultima IV manufactured by Rigaku Corporation was used as the measuring device, and the measuring conditions were as follows; namely, tube voltage of 40 kv, tube current of 30 mA, scan speed of 4°/min, and step of 0.02°.

Moreover, the rate of change of thermal expansion coefficient was measured by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.6%.

Figure 2:
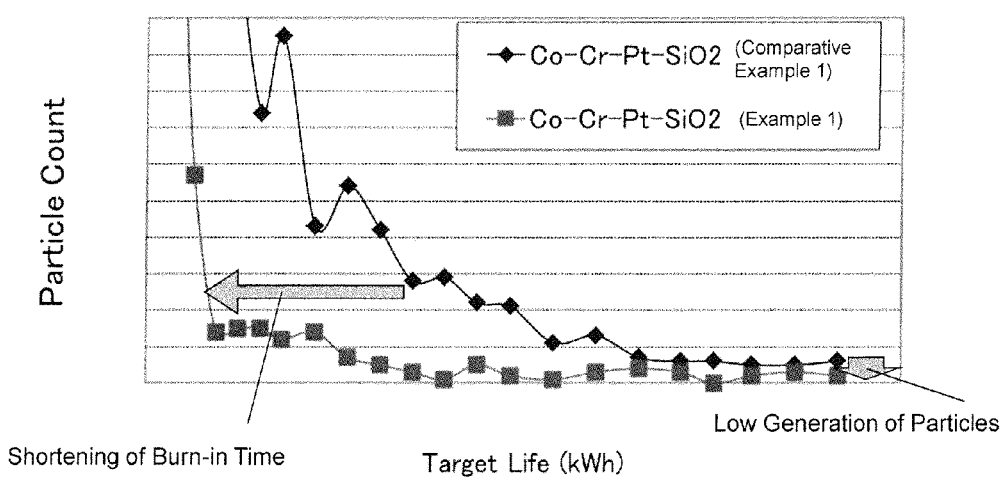
FIG. 2 This is a diagram showing the comparative result of the target life relative to the number of particles upon sputtering the Co—Cr—Pt—$SiO_2$ targets of Example 1 and Comparative Example 1.

FIG. 2 shows the comparative result of the target life relative to the number of particles upon sputtering the Co—Cr—Pt—$SiO_2$ targets of Example 1 and Comparative Example 1. The sputtering conditions were as follows; namely, power of 1 kW, time of 20 seconds, and pressure (Ar atmosphere) of 1.7 Pa.

As a result of sputtering the target of Example 1, the number of generated particles in a steady state was 2.8 particles. Moreover, if the time, in which the initial number of particles that are generated at the start of sputtering becomes 30 particles or less, is defined as the burn-in time; the burn-in time was 0.37 kWh. Accordingly, when the peak intensity of cristobalites (crystallized $SiO_2$) is low, the burn-in is shortened and the number of generated particles is reduced. The following Examples and Comparative Examples yielded the same results as shown in FIG. 2.

Comparative Example 1

In Comparative Example 1, Co powder having an average grain size of 3 µm, Cr powder having an average grain size of 5 µm, Pt powder having an average grain size of 1 µm, and amorphous $SiO_2$ powder having an average grain size of 1 µm were prepared as the raw powders. The foregoing powders were weighed at a weight percentage as follows; that is, 70.76 wt % of Co powder, 9.6 wt % of Cr powder, 15.01 wt % of Pt powder, and 4.62 wt % of $SiO_2$ powder; to achieve a target composition of 78Co-12Cr-5Pt-5$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 2 hours, and pressure of 30 MPa; to obtain a sintered compact. This sintered compact was processed with a lathe to obtain a disk-shaped target having a diameter of 180 mm and thickness of 7 mm.

Figure 3:
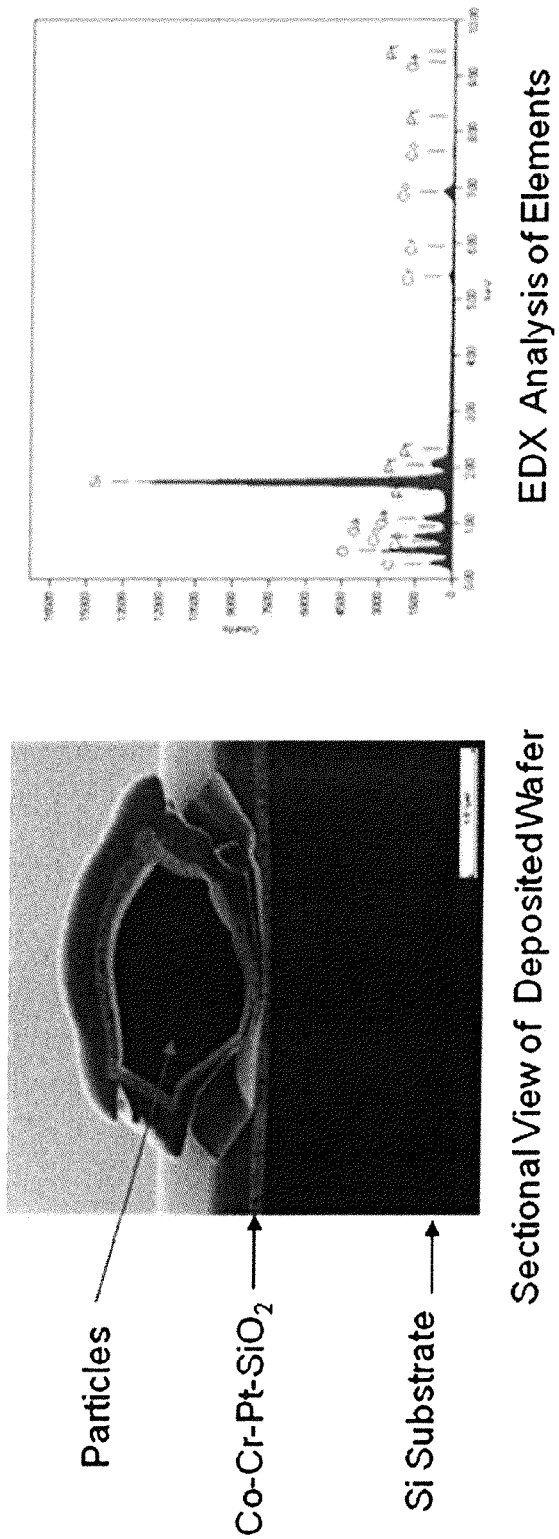
FIG. 3 One is a diagram showing the cross section of the wafer deposited on the substrate of Comparative Example 1, and the other is a result of the elemental analysis via EDX.
Figure 4:
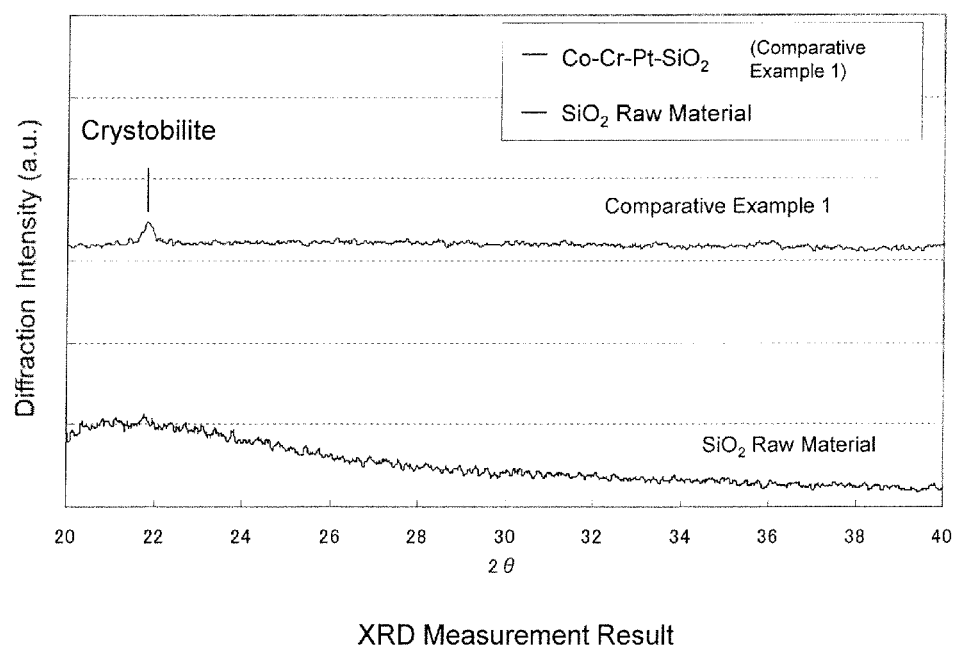
FIG. 4 This is a diagram showing the measurement results of the X-ray diffraction intensity of the $SiO_2$ raw material and the Co—Cr—Pt—$SiO_2$ target of Comparative Example 1.

The prepared Co—Cr—Pt—$SiO_2$ target was sputtered for the deposition onto a Si substrate (wafer), and the status of particles was examined. The cross-section view of the wafer deposited on the substrate and the elemental analysis via EDX are shown in FIG. 3. The left side of FIG. 3 shows the particles and, as evident from the elemental analysis on the right side of FIG. 3, most of the particles were $SiO_2$.

The peak intensity of cristobalites was measured, as with Example 1, by cutting out a piece from the target and subjecting it to measurement of the X-ray diffraction intensity via the X-ray diffraction (XRD) method. The results are shown in FIG. 2. While the $SiO_2$ raw material is amorphous, a peak of cristobalites appeared at 2θ:21.98° in the sintered target as shown therein. The lower line shows the X-ray diffraction intensity of the $SiO_2$ raw material, and is shown by way of reference.

The peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 56, and the ratio of the peak intensity of cristobalites, which are crystallized $SiO_2$, to the background intensity (cristobalite peak intensity/background intensity) was 1.42. Both of these values were greater in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 7.5% and greater in comparison to Example 1, whereby a volume change occurred, and micro cracks were generated in the target due to such volume change.

As a result of sputtering this target, the number of generated particles in a steady state increased to 6.7 particles. Moreover, the burn-in time of sputtering was 1.42 kWh, and the burn-in time became longer. Accordingly, when the peak intensity of cristobalites (crystallized $SiO_2$) increases, the burn-in time of sputtering becomes longer, and the number of generated particles during sputtering also increased.

Comparative Example 2

In Comparative Example 2, Co powder having an average grain size of 3 µm, Cr powder having an average grain size of 5 µm, and amorphous $SiO_2$ powder having an average grain size of 1 µm were prepared as the raw powders. The foregoing powders were weighed at a weight percentage as follows; that is, 84.11 wt % of Co powder, 10.73 wt % of Cr powder, and 5.17 wt % of $SiO_2$ powder; to achieve a target composition of 83Co-12Cr-5$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 129, and the ratio of the peak intensity of cristobalites, which are crystallized $SiO_2$, to the background intensity (cristobalite peak intensity/background intensity) also increased to 1.92. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 11.2% and greater in comparison to Example 1, whereby a volume change occurred, and micro cracks were generated in the target due to such volume change.

As a result of sputtering this target, the number of generated particles in a steady state increased to 8.7 particles. Moreover, the burn-in time of sputtering was 1.75 kWh, and the burn-in time became longer. Accordingly, when the peak intensity of cristobalites (crystallized $SiO_2$) increases, the burn-in time of sputtering becomes longer, and the number of generated particles during sputtering also increased.

Example 2

In Example 2, Co powder having an average grain size of 3 µm, Cr powder having an average grain size of 5 µm, and amorphous SiO$_2$ powder having an average grain size of 1 μm were prepared as the raw powders. The foregoing powders were weighed at a weight percentage as follows; that is, 84.11 wt % of Co powder, 10.73 wt % of Cr powder, and 5.17 wt % of SiO$_2$ powder; to achieve a target composition of 83Co-12Cr-5SiO$_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1060° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 31. Moreover, the ratio of the peak intensity of cristobalites, which are crystallized SiO$_2$, to the background intensity (cristobalite peak intensity/background intensity) was 1.13. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 5.5%.

As a result of sputtering this target, the number of generated particles in a steady state was 2.5 particles. Moreover, the burn-in time of sputtering was 0.53 kWh. Accordingly, when the peak intensity of cristobalites (crystallized SiO$_2$) is low, the burn-in is shortened and the number of generated particles is reduced.

Example 3

In Example 3, Co powder having an average grain size of 3 μm, Cr powder having an average grain size of 5 μm, Pt powder having an average grain size of 1 μm, Co—B powder having an average grain size of 5 μm, and amorphous SiO$_2$ powder having an average grain size of 1 μm were prepared as the raw powders. The foregoing powders were weighed at a weight percentage as follows; that is, 53.05 wt % of Co powder, 10.64 wt % of Cr powder, 31.93 wt % of Pt powder, 0.29 wt % of B powder, and 4.10 wt % of SiO$_2$ powder; to achieve a target composition of 66Co-15Cr-12Pt-2B-5SiO$_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 900° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 30, and the ratio of the peak intensity of cristobalites, which are crystallized SiO$_2$, to the background intensity (cristobalite peak intensity/background intensity) was 1.04. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.8%.

As a result of sputtering this target, the number of generated particles in a steady state was 0.4 particles. Moreover, the burn-in time of sputtering was 0.21 kWh. Accordingly, when the peak intensity of cristobalites (crystallized SiO$_2$) is low, the burn-in is shortened and the number of generated particles is reduced.

Example 4

In Example 4, Co powder having an average grain size of 3 μm, Cr powder having an average grain size of 5 μm, Pt powder having an average grain size of 1 μm, TiO$_2$ powder having an average grain size of 1 μm, amorphous SiO$_2$ powder having an average grain size of 1 μm, and Cr$_2$O$_3$ powder having an average grain size of 1 μm were prepared as the raw powders. The foregoing powders were weighed at a weight percentage as follows; that is, 48.09 wt % of Co powder, 6.33 wt % of Cr powder, 35.64 wt % of Pt powder, 0.69 wt % of TiO$_2$ powder, 0.67 wt % of SiO$_2$ powder, and 1.07 wt % of Cr$_2$O$_3$ powder; to achieve a target composition of 67Co-10Cr-15Pt-3TiO$_2$-2SiO$_2$-3Cr$_2$O$_3$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 32. Moreover, the ratio of the peak intensity of cristobalites, which are crystallized SiO$_2$, to the background intensity (cristobalite peak intensity/background intensity) was 1.18.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.3%.

As a result of sputtering this target, the number of generated particles in a steady state was 2 particles. Moreover, the burn-in time of sputtering was 0.2 kWh. Accordingly, when the peak intensity of cristobalites (crystallized SiO$_2$) is low, the burn-in is shortened and the number of generated particles is reduced.

Comparative Example 3

In Comparative Example 3, Co powder having an average grain size of 3 μm, Cr powder having an average grain size of 5 μm, TiO$_2$ powder having an average grain size of 1 μm, amorphous SiO$_2$ powder having an average grain size of 1 μm, and Cr$_2$O$_3$ powder having an average grain size of 1 μm were prepared as the raw powders. The foregoing powders were weighed at a weight percentage as follows; that is, 78.35 wt % of Co powder, 8.43 wt % of Cr powder, 3.88 wt % of TiO$_2$ powder, 1.95 wt % of SiO$_2$ powder, and 7.39 wt % of Cr$_2$O$_3$ powder; to achieve a target composition of 82Co-10Cr-3TiO$_2$-2SiO$_2$-3Cr$_2$O$_3$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 317, and the ratio of the peak intensity of cristobalites, which are crystallized SiO$_2$, to the background intensity (cristobalite peak intensity/background intensity) also increased to 4.71. Consequently, most of the SiO$_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 8.5% and greater in comparison to Example 1, whereby a volume change occurred, and micro cracks were generated in the target due to such volume change.

As a result of sputtering this target, the number of generated particles in a steady state increased to 13.5 particles. Moreover, the burn-in time of sputtering was 2 kWh, and the burn-in time became longer. Accordingly, when the peak intensity of cristobalites (crystallized SiO$_2$) increases, the burn-in time of sputtering becomes longer, and the number of generated particles during sputtering also increased.

Comparative Example 4

In Comparative Example 4, Co powder having an average grain size of 3 μm, Cr powder having an average grain size of 5 μm, Pt powder having an average grain size of 1 μm, TiO$_2$ powder having an average grain size of 1 μm, amorphous SiO$_2$ powder having an average grain size of 1 μm, and Cr$_2$O$_3$ powder having an average grain size of 1 μm were prepared as the raw powders. The foregoing powders were weighed at a weight percentage as follows; that is, 48.09 wt % of Co powder, 6.33 wt % of Cr powder, 35.64 wt % of Pt powder, 0.69 wt % of TiO$_2$ powder, 0.67 wt % of SiO$_2$ powder, and 1.07 wt % of Cr$_2$O$_3$ powder; to achieve a target composition of 67Co-10Cr-15Pt-3TiO$_2$-2SiO$_2$-3Cr$_2$O$_3$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 62, and the ratio of the peak intensity of cristobalites, which are crystallized SiO$_2$, to the background intensity (cristobalite peak intensity/background intensity) also increased to 1.57. Consequently, most of the SiO$_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 7.6% and greater in comparison to Example 1, whereby a volume change occurred, and micro cracks were generated in the target due to such volume change.

As a result of sputtering this target, the number of generated particles in a steady state increased to 7.2 particles. Moreover, the burn-in time of sputtering was 1.42 kWh, and the burn-in time became longer. Accordingly, when the peak intensity of cristobalites (crystallized $SiO_2$) increases, the burn-in time of sputtering becomes longer, and the number of generated particles during sputtering also increased.

Example 5

In Example 5, Co powder having an average grain size of 3 μm, Cr powder having an average grain size of 5 μm, Pt powder having an average grain size of 1 μm, Ru powder having an average grain size of 8 μm, $TiO_2$ powder having an average grain size of 1 μm, amorphous $SiO_2$ powder having an average grain size of 1 μm, and $Cr_2O_3$ powder having an average grain size of 1 μm were prepared as the raw powders. The foregoing powders were weighed at a weight percentage as follows; that is, 45.19 wt % of Co powder, 2.98 wt % of Cr powder, 40.19 wt % of Pt powder, 2.31 wt % of Ru powder, 2.74 wt % of $TiO_2$ powder, 1.38 wt % of $SiO_2$ powder, and 5.22 wt % of $Cr_2O_3$ powder; to achieve a target composition of 67Co-5Cr-18Pt-2Ru-3$TiO_2$-2$SiO_2$-3$Cr_2O_3$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 35. Moreover, the ratio of the peak intensity of cristobalites, which are crystallized $SiO_2$, to the background intensity (cristobalite peak intensity/background intensity) was 1.28.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 7.8%.

As a result of sputtering this target, the number of generated particles in a steady state was 2.2 particles. Moreover, the burn-in time of sputtering was 0.51 kWh. Accordingly, when the peak intensity of cristobalites (crystallized $SiO_2$) is low, the burn-in is shortened and the number of generated particles is reduced.

Comparative Example 5

In Comparative Example 5, Fe powder having an average grain size of 5 μm, Pt powder having an average grain size of 1 μm, and amorphous $SiO_2$ powder having an average grain size of 1 μm were prepared as the raw powders. The foregoing powders were weighed at a weight percentage as follows; that is, 21.13 wt % of Fe powder, 73.82 wt % of Pt powder, and 5.05 wt % of $SiO_2$ powder; to achieve a target composition of 45Fe-45Pt-10$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 224, and the ratio of the peak intensity of cristobalites, which are crystallized $SiO_2$, to the background intensity (cristobalite peak intensity/background intensity) also increased to 3.4. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 8.1% and greater in comparison to Example 1, whereby a volume change occurred, and micro cracks were generated in the target due to such volume change.

As a result of sputtering this target, the number of generated particles in a steady state increased to 10.1 particles. Moreover, the burn-in time of sputtering was 2.1 kWh, and the burn-in time became longer. Accordingly, when the peak intensity of cristobalites (crystallized $SiO_2$) increases, the burn-in time of sputtering becomes longer, and the number of generated particles during sputtering also increased.

Example 6

In Example 6, Fe powder having an average grain size of 5 μm, Pt powder having an average grain size of 1 μm, and amorphous $SiO_2$ powder having an average grain size of 1 μm were prepared as the raw powders. The foregoing powders were weighed at a weight percentage as follows; that is, 21.13 wt % of Fe powder, 73.82 wt % of Pt powder, and 5.05 wt % of $SiO_2$ powder; to achieve a target composition of 45Fe-45Pt-10$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 30. Moreover, the ratio of the peak intensity of cristobalites, which are crystallized $SiO_2$, to the background intensity (cristobalite peak intensity/background intensity) was 1.12. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.7%.

As a result of sputtering this target, the number of generated particles in a steady state was 2.7 particles. Moreover, the burn-in time of sputtering was 0.6 kWh. Accordingly, when the peak intensity of cristobalites (crystallized $SiO_2$) is low, the burn-in is shortened and the number of generated particles is reduced.

Example 7

In Example 7, Co powder having an average grain size of 3 μm, Pt powder having an average grain size of 1 μm, $TiO_2$ powder having an average grain size of 1 μm, and amorphous $SiO_2$ powder having an average grain size of 1 μm were prepared as the raw powders. The foregoing powders were weighed at a weight percentage as follows; that is, 67.62 wt % of Co powder, 26.65 wt % of Pt powder, 3.27 wt % of $TiO_2$ powder, and 2.46 wt % of $SiO_2$ powder; to achieve a target composition of 84Co-10Pt-3$TiO_2$-3$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1060° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 30. Moreover, the ratio of the peak intensity of cristobalites, which are crystallized $SiO_2$, to the background intensity (cristobalite peak intensity/background intensity) was 1.11. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.5%.

As a result of sputtering this target, the number of generated particles in a steady state was 2.4 particles. Moreover, the burn-in time of sputtering was 0.41 kWh. Accordingly, when the peak intensity of cristobalites (crystallized $SiO_2$) is low, the burn-in is shortened and the number of generated particles is reduced.

Comparative Example 6

In Comparative Example 6, Co powder having an average grain size of 3 μm, Pt powder having an average grain size of 1 μm, $TiO_2$ powder having an average grain size of 1 μm, and amorphous $SiO_2$ powder having an average grain size of 1 μm were prepared as the raw powders. The foregoing powders were weighed at a weight percentage as follows; that is, 67.62 wt % of Co powder, 26.65 wt % of Pt powder, 3.27 wt % of $TiO_2$ powder, and 2.46 wt % of $SiO_2$ powder; to achieve a target composition of 84Co-10Pt-3$TiO_2$-3$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 55, and the ratio of the peak intensity of cristobalites, which are crystallized $SiO_2$, to the background intensity (cristobalite peak intensity/background intensity) also increased to 1.43. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 8.3% and greater in comparison to Example 1, whereby a volume change occurred, and micro cracks were generated in the target due to such volume change.

As a result of sputtering this target, the number of generated particles in a steady state increased to 7.1 particles. Moreover, the burn-in time of sputtering was 1.24 kWh, and the burn-in time became longer. Accordingly, when the peak intensity of cristobalites (crystallized $SiO_2$) increases, the burn-in time of sputtering becomes longer, and the number of generated particles during sputtering also increased.

Example 8

In Example 8, Co powder having an average grain size of 3 µm, Cr powder having average grain size of 5 µm, Pt powder having an average grain size of 1 µm, $Ta_2O_5$ powder having an average grain size of 1 µm, and amorphous $SiO_2$ powder having an average grain size of 1 µm were prepared as the raw powders. The foregoing powders were weighed at a weight percentage as follows; that is, 44.55 wt % of Co powder, 4.37 wt % of Cr powder, 26.63 wt % of Pt powder, 23.2 wt % of $Ta_2O_5$ powder, and 1.26 wt % of $SiO_2$ powder; to achieve a target composition of 72Co-8Cr-13Pt-5$Ta_2O_5$-2$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1060° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 32. Moreover, the ratio of the peak intensity of cristobalites, which are crystallized $SiO_2$, to the background intensity (cristobalite peak intensity/background intensity) was 1.18.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.6%.

As a result of sputtering this target, the number of generated particles in a steady state was 2.2 particles. Moreover, the burn-in time of sputtering was 0.21 kWh. Accordingly, when the peak intensity of cristobalites (crystallized $SiO_2$) is low, the burn-in is shortened and the number of generated particles is reduced.

Comparative Example 7

In Comparative Example 7, Co powder having an average grain size of 3 µm, Cr powder having an average grain size of 5 µm, Pt powder having an average grain size of 1 µm, $Ta_2O_5$ powder having an average grain size of 1 µm, and amorphous $SiO_2$ powder having an average grain size of 1 µm were prepared as the raw powders. The foregoing powders were weighed at a weight percentage as follows; that is, 44.55 wt % of Co powder, 4.37 wt % of Cr powder, 26.63 wt % of Pt powder, 23.2 wt % of $Ta_2O_5$ powder, and 1.26 wt % of $SiO_2$ powder; to achieve a target composition of 72Co-8Cr-13Pt-5$Ta_5O_2$-2$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 109, and the ratio of the peak intensity of cristobalites, which are crystallized $SiO_2$, to the background intensity (cristobalite peak intensity/background intensity) also increased to 2.81. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 7.7% and greater in comparison to Example 1, whereby a volume change occurred, and micro cracks were generated in the target due to such volume change.

As a result of sputtering this target, the number of generated particles in a steady state increased to 9.1 particles. Moreover, the burn-in time of sputtering was 1.83 kWh, and the burn-in time became longer. Accordingly, when the peak intensity of cristobalites (crystallized $SiO_2$) increases, the burn-in time of sputtering becomes longer, and the number of generated particles during sputtering also increased.

Example 9

In Example 9, Co powder having an average grain size of 3 µm, Cr powder having average grain size of 5 µm, Pt powder having an average grain size of 1 µm, Co—B powder having an average grain size of 5 µm, amorphous $SiO_2$ powder having an average grain size of 1 µm, and CoO powder having an average grain size of 1 µm were prepared as the raw powders. The foregoing powders were weighed at a weight percentage as follows; that is, 56.30 wt % of Co powder, 3.50 wt % of Cr powder, 31.50 wt % of Pt powder, 0.44 wt % of B powder, 3.23 wt % of $SiO_2$ powder, and 5.04 wt % of CoO powder; to achieve a target composition of 71Co-5Cr-12Pt-3B-4$SiO_2$-5CoO (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 33. Moreover, the ratio of the peak intensity of cristobalites, which are crystallized $SiO_2$, to the background intensity (cristobalite peak intensity/background intensity) was 1.21.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.6%.

As a result of sputtering this target, the number of generated particles in a steady state was 2.6 particles. Moreover, the burn-in time of sputtering was 0.47 kWh. Accordingly, when the peak intensity of cristobalites (crystallized $SiO_2$) is low, the burn-in is shortened and the number of generated particles is reduced.

Comparative Example 8

In Comparative Example 8, Co powder having an average grain size of 3 µm, Cr powder having an average grain size of 5 µm, Pt powder having an average grain size of 1 µm, Co—B powder having an average grain size of 5 µm, amorphous $SiO_2$ powder having an average grain size of 1 µm, and CoO powder having an average grain size of ○ µm were prepared as the raw powders. The foregoing powders were weighed at a weight percentage as follows; that is, 56.30 wt % of Co powder, 3.50 wt % of Cr powder, 31.50 wt % of Pt powder, 0.44 wt % of B powder, 3.23 wt % of $SiO_2$ powder, and 5.04 wt % of CoO powder; to achieve a target composition of 71Co-5Cr-12Pt-3B-4$SiO_2$-5CoO (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 64, and the ratio of the peak intensity of cristobalites, which are crystallized $SiO_2$, to the background intensity (cristobalite peak intensity/background intensity) also increased to 1.67. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 7.4% and greater in comparison to Example 1, whereby a volume change occurred, and micro cracks were generated in the target due to such volume change.

As a result of sputtering this target, the number of generated particles in a steady state increased to 9.8 particles. Moreover, the burn-in time of sputtering was 1.37 kWh, and the burn-in time became longer. Accordingly, when the peak intensity of cristobalites (crystallized $SiO_2$) increases, the burn-in time of sputtering becomes longer, and the number of generated particles during sputtering also increased.

Example 10

In Example 10, Fe powder having an average grain size of 5 µm, Pt powder having an average grain size of 1 µm, Au powder having an average grain size of 5 µm, and amorphous $SiO_2$ powder having an average grain size of 1 µm were prepared as the raw powders. The foregoing powders were weighed at a weight percentage as follows; that is, 17.72 wt % of Fe powder, 61.89 wt % of Pt powder, 15.62 wt % of Au powder, and 4.77 wt % of $SiO_2$ powder; to achieve a target composition of 40Fe-40Pt-10Au-10$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 31. Moreover, the ratio of the peak intensity of cristobalites, which are crystallized $SiO_2$, to the background intensity (cristobalite peak intensity/background intensity) was 1.13. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.4%.

As a result of sputtering this target, the number of generated particles in a steady state was 2.6 particles. Moreover, the burn-in time of sputtering was 0.52 kWh. Accordingly, when the peak intensity of cristobalites (crystallized $SiO_2$) is low, the burn-in is shortened and the number of generated particles is reduced.

Comparative Example 9

In Comparative Example 9, Fe powder having an average grain size of 5 μm, Pt powder having an average grain size of 1 μm, Au powder having an average grain size of 5 μm, and amorphous $SiO_2$ powder having an average grain size of 1 μm were prepared as the raw powders. The foregoing powders were weighed at a weight percentage as follows; that is, 17.72 wt % of Fe powder, 61.89 wt % of Pt powder, 15.62 wt % of Au powder, and 4.77 wt % of $SiO_2$ powder; to achieve a target composition of 40Fe-40Pt-10Au-10$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 70, and the ratio of the peak intensity of cristobalites, which are crystallized $SiO_2$, to the background intensity (cristobalite peak intensity/background intensity) also increased to 1.86. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 8.1% and greater in comparison to Example 1, whereby a volume change occurred, and micro cracks were generated in the target due to such volume change.

As a result of sputtering this target, the number of generated particles in a steady state increased to 9.2 particles. Moreover, the burn-in time of sputtering was 1.78 kWh, and the burn-in time became longer. Accordingly, when the peak intensity of cristobalites (crystallized $SiO_2$) increases, the burn-in time of sputtering becomes longer, and the number of generated particles during sputtering also increased.

Example 11

In Example 11, Fe powder having an average grain size of 5 μm, Pt powder having an average grain size of 1 μm, Cu powder having an average grain size of 5 μm, and amorphous $SiO_2$ powder having an average grain size of 1 μm were prepared as the raw powders. The foregoing powders were weighed at a weight percentage as follows; that is, 18.87 wt % of Fe powder, 64.17 wt % of Pt powder, 12.64 wt % of Cu powder, and 4.82 wt % of $SiO_2$ powder; to achieve a target composition of 41Fe-41Pt-8Cu-10$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 33. Moreover, the ratio of the peak intensity of cristobalites, which are crystallized $SiO_2$, to the background intensity (cristobalite peak intensity/background intensity) was 1.2. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5°

C./min from 250° C. to 350° C. The rate of change of thermal expansion coefficient during temperature rising from 250° C. to 350° C. was 3.5%.

As a result of sputtering this target, the number of generated particles in a steady state was 2.3 particles. Moreover, the burn-in time of sputtering was 0.45 kWh. Accordingly, when the peak intensity of cristobalites (crystallized $SiO_2$) is low, the burn-in is shortened and the number of generated particles is reduced.

Comparative Example 10

In Comparative Example 10, Fe powder having an average grain size of 5 μm, Pt powder having an average grain size of 1 μm, Cu powder having an average grain size of 5 μm, and amorphous $SiO_2$ powder having an average grain size of 1 μm were prepared as the raw powders. The foregoing powders were weighed at a weight percentage as follows; that is, 18.87 wt % of Fe powder, 64.17 wt % of Pt powder, 12.64 wt % of Cu powder, and 4.82 wt % of $SiO_2$ powder; to achieve a target composition of 41Fe-41Pt-8Cu-10$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 47, and the ratio of the peak intensity of cristobalites, which are crystallized $SiO_2$, to the background intensity (cristobalite peak intensity/background intensity) also increased to 1.73. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 7.9% and greater in comparison to Example 1, whereby a volume change occurred, and micro cracks were generated in the target due to such volume change.

As a result of sputtering this target, the number of generated particles in a steady state increased to 6.9 particles. Moreover, the burn-in time of sputtering was 1.34 kWh, and the burn-in time became longer. Accordingly, when the peak intensity of cristobalites (crystallized $SiO_2$) increases, the burn-in time of sputtering becomes longer, and the number of generated particles during sputtering also increased.

Example 12

In Example 12, Fe powder having an average grain size of 5 μm, Pt powder having an average grain size of 1 μm, Ag powder having an average grain size of 5 μm, and amorphous $SiO_2$ powder having an average grain, size of 1 μm were prepared as the raw powders. The foregoing powders were weighed at a weight percentage as follows; that is, 20.96 wt % of Fe powder, 73.23 wt % of Pt powder, 1.8 wt % of Ag powder, and 4.01 wt % of $SiO_2$ powder; to achieve a target composition of 45Fe-45Pt-2Ag-8$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 32. Moreover, the ratio of the peak intensity of cristobalites, which are crystallized $SiO_2$, to the background intensity (cristobalite peak intensity/background intensity) was 1.18. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.6%.

As a result of sputtering this target, the number of generated particles in a steady state was 2.1 particles. Moreover, the burn-in time of sputtering was 0.39 kWh. Accordingly, when the peak intensity of cristobalites (crystallized $SiO_2$) is low, the burn-in is shortened and the number of generated particles is reduced.

Comparative Example 11

In Comparative Example 11, Fe powder having an average grain size of 5 μm, Pt powder having an average grain size of 1 μm, Ag powder having an average grain size of 5 μm, and amorphous $SiO_2$ powder having an average grain size of 1 μm were prepared as the raw powders. The foregoing powders were weighed at a weight percentage as follows; that is, 20.96 wt % of Fe powder, 73.23 wt % of Pt powder, 1.8 wt % of Ag powder, and 4.01 wt % of $SiO_2$ powder; to achieve a target composition of 45Fe-45Pt-2Ag-8$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 134, and the ratio of the peak intensity of cristobalites, which are crystallized $SiO_2$, to the background intensity (cristobalite peak intensity/background intensity) also increased to 2.02. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 7.8% and greater in comparison to Example 1, whereby a volume change occurred, and micro cracks were generated in the target due to such volume change.

As a result of sputtering this target, the number of generated particles in a steady state increased to 10.1 particles. Moreover, the burn-in time of sputtering was 1.91 kWh, and the burn-in time became longer. Accordingly, when the peak intensity of cristobalites (crystallized $SiO_2$) increases, the burn-in time of sputtering becomes longer, and the number of generated particles during sputtering also increased.

Example 13

In Example 13, Co powder having an average grain size of 3 μm, Cr powder having an average grain size of 5 μm, and amorphous $SiO_2$ powder having an average grain size of 1 μm were prepared as the raw powders. The foregoing powders were weighed at a weight percentage as follows; that is, 47.08 wt % of Co powder, 36.92 wt % of Cr powder, and 16.00 wt % of $SiO_2$ powder; to achieve a target composition of 45Co-40Cr-15$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1060° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 32. Moreover, the ratio of the peak intensity of cristobalites, which are crystallized $SiO_2$, to the background intensity (cristobalite peak intensity/background intensity) was 1.15. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 6.1%.

As a result of sputtering this target, the number of generated particles in a steady state was 2.4 particles. Moreover, the burn-in time of sputtering was 0.74 kWh. Accordingly, when the peak intensity of cristobalites (crystallized $SiO_2$) is low, the burn-in is shortened and the number of generated particles is reduced.

Comparative Example 12

In Comparative Example 11, Co powder having an average grain size of 3 μm, Cr powder having an average grain size of 5 μm, and amorphous $SiO_2$ powder having an average grain size of 1 μm were prepared as the raw powders. The foregoing powders were weighed at a weight percentage as follows; that is, 47.08 wt % of Co powder, 36.92 wt % of Cr powder, and 16.00 wt % of $SiO_2$ powder; to achieve a target composition of 45Co-40Cr-15$SiO_2$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1160° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° increased to 161, and the ratio of the peak intensity of cristobalites, which are crystallized $SiO_2$: to the background intensity (cristobalite peak intensity/background intensity) also increased to 2.41. Consequently, most of the $SiO_2$ had crystallized in comparison to Example 1.

Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 9.2% and greater in comparison to Example 1, whereby a volume change occurred, and micro cracks were generated in the target due to such volume change.

As a result of sputtering this target, the number of generated particles in a steady state increased to 11.1 particles. Moreover, the burn-in time of sputtering was 2.32 kWh, and the burn-in time became longer. Accordingly, when the peak intensity of cristobalites (crystallized $SiO_2$) increases, the burn-in time of sputtering becomes longer, and the number of generated particles during sputtering also increased.

Example 14

In Example 14, Co powder having an average grain size of 3 μm, Cr powder having an average grain size of 5 μm, $TiO_2$ powder having an average grain size of 1 μm, amorphous $SiO_2$ powder having an average grain size of 1 μm, and $Cr_2O_3$ powder having an average grain size of 1 μm were prepared as the raw powders. The foregoing powders were weighed at a weight percentage as follows; that is, 78.35 wt % of Co powder, 8.43 wt % of Cr powder, 3.88 wt % of $TiO_2$ powder, 1.95 wt % of $SiO_2$ powder, and 7.39 wt % of $Cr_2O_3$ powder; to achieve a target composition of 82Co-10Cr-3$TiO_2$-2$SiO_2$-3$Cr_2O_3$ (mol %).

These powders were placed, together with zirconia balls as the grinding medium, in a ball mill pot with a capacity of 10 liters, and it was rotated for 20 hours to mix the raw powders.

Subsequently, this mixed powder was filled in a carbon mold, and hot pressed in a vacuum atmosphere under the following conditions; namely, temperature of 1090° C., holding time of 3 hours, and pressure of 30 MPa; to obtain a sintered compact. This sintered compact was processed with a lathe to obtain a disk-shaped target having a diameter of 180 mm and thickness of 7 mm.

The peak intensity of cristobalites was measured, as with Example 1, by cutting out a piece from the target and subjecting it to measurement of the X-ray diffraction intensity via the X-ray diffraction (XRD) method. In other words, the peak intensity appearing at 2θ:21.98°, and the background intensity, ((average value of intensity at 20.5 to 21.5°)+(average value of intensity at 22.5 to 23.5°))÷2, were measured. Consequently, the peak intensity appearing at 2θ:21.98° was 40. Moreover, the ratio of the peak intensity of cristobalites, which are crystallized $SiO_2$, to the background intensity (cristobalite peak intensity/background intensity) was 1.20. Note that the measuring device and the measuring conditions were the same as Example 1.

Moreover, the rate of change of the thermal expansion coefficient was measured, as with Example 1, by cutting out a piece having a size of 20 mm×3 mm×3 mm from the target, and using Thermoplus 2 TMA8310 manufactured by Rigaku Corporation to measure the rate of change of thermal expansion coefficient at a rate of temperature increase of 5° C./min from 250° C. to 350° C. The rate of change of thermal expansion coefficient during temperature rising from 250° C. to 350° C. was 3.2%.

As a result of sputtering this target, the number of generated particles in a steady state was 2.6 particles. Moreover, the burn-in time of sputtering was 0.52 kWh. Accordingly, when the peak intensity of cristobalites (crystallized $SiO_2$) is low, the burn-in is shortened and the number of generated particles is reduced.

The foregoing results are summarized in Table 1. As shown in Table 1, with all Examples of the sputtering target of the present invention, the peak intensity ratio of cristobalites was 1.40 or less and within the scope of the present invention, and resulted in the fewer generation of particles during sputtering and shorter burn-in time of sputtering in comparison to the Comparative Examples.

TABLE 1

|  | Composition | Composition Ratio (mol %) | Composition Ratio (wt %) |
|---|---|---|---|
| Example 1 | Co—Cr—Pt—$SiO_2$ | 78-12-5-5 | 70.76-9.6-15.01-4.62 |
| Comparative Example 1 | Co—Cr—Pt—$SiO_2$ | 78-12-5-5 | 70.76-9.6-15.01-4.62 |
| Comparative Example 2 | Co—Cr—$SiO_2$ | 83-12-5 | 84.11-10.73-5.17 |
| Example 2 | Co—Cr—$SiO_2$ | 83-12-5 | 84.11-10.73-5.17 |
| Example 3 | Co—Cr—Pt—B—$SiO_2$ | 66-15-12-2-5 | 53.05-10.64-31.93-0.29-4.10 |
| Example 4 | Co—Cr—Pt—$TiO_2$—$SiO_2$—$Cr_2O_3$ | 67-10-15-3-2-3 | 48.09-6.33-35.64-0.69-0.67-1.07 |
| Comparative Example 3 | Co—Cr—$TiO_2$—$SiO_2$—$Cr_2O_3$ | 82-10-3-2-3 | 78.35-8.43-3.88-1.95-7.39 |
| Comparative Example 4 | Co—Cr—Pt—$TiO_2$—$SiO_2$—$Cr_2O_3$ | 67-10-15-3-2-3 | 48.09-6.33-35.64-0.69-0.67-1.07 |
| Example 5 | Co—Cr—Pt—Ru—$TiO_2$—$SiO_2$—$Cr_2O_3$ | 67-5-18-2-3-2-3 | 45.19-2.98-40.19-2.31-2.74-1.38-5.22 |
| Comparative Example 5 | Fe—Pt—$SiO_2$ | 45-45-10 | 21.13-73.82-5.05 |
| Example 6 | Fe—Pt—$SiO_2$ | 45-45-10 | 21.13-73.82-5.05 |
| Example 7 | Co—Pt—TiO2—$SiO_2$ | 84-10-3-3 | 67.62-26.65-3.27-2.46 |
| Comparative Example 6 | Co—Pt—TiO2—$SiO_2$ | 84-10-3-3 | 67.62-26.65-3.27-2.46 |
| Example 8 | Co—Cr—Pt—$Ta_2O_5$—$SiO_2$ | 72-8-13-5-2 | 44.55-4.37-26.63-23.2-1.26 |
| Comparative Example 7 | Co—Cr—Pt—$Ta_2O_5$—$SiO_2$ | 72-8-13-5-2 | 44.55-4.37-26.63-23.2-1.26 |
| Example 9 | Co—Cr—Pt—B—$SiO_2$—CoO | 71-5-12-3-4-5 | 56.30-3.50-31.50-0.44-3.23-5.04 |
| Comparative Example 8 | Co—Cr—Pt—B—$SiO_2$—CoO | 71-5-12-3-4-5 | 56.30-3.50-31.50-0.44-3.23-5.04 |
| Example 10 | Fe—Pt—Au—$SiO_2$ | 40-40-10-10 | 17.72-61.89-15.62-4.77 |

TABLE 1-continued

| | | | |
|---|---|---|---|
| Comparative Example 9 | Fe—Pt—Au—SiO$_2$ | 40-40-10-10 | 17.72-61.89-15.62-4.77 |
| Example 11 | Fe—Pt—Cu—SiO$_2$ | 41-41-8-10 | 18.87-64.17-12.64-4.82 |
| Comparative Example 10 | Fe—Pt—Cu—SiO$_2$ | 41-41-8-10 | 18.87-64.17-12.64-4.82 |
| Example 12 | Fe—Pt—Ag—SiO$_2$ | 45-45-2-8 | 20.96-73.23-1.8-4.01 |
| Comparative Example 11 | Fe—Pt—Ag—SiO$_2$ | 45-45-2-8 | 20.96-73.23-1.8-4.01 |
| Example 13 | Co—Cr—SiO$_2$ | 45-40-15 | 47.08-36.92-16.00 |
| Comparative Example 12 | Co—Cr—SiO$_2$ | 45-40-15 | 47.08-36.92-16.00 |
| Example 14 | Co—Cr—TiO$_2$—SiO$_2$—Cr$_2$O$_3$ | 82-10-3-2-3 | 78.35-8.43-3.88-1.95-7.39 |

| | Hot Press Temperature (° C.) | Intensity at 21.98° | Peak Intensity Ratio of Cristobalites | Rate of Change of Thermal Expansion Coefficient (%) | Burn-in Time (kwh) | Amount of Particles |
|---|---|---|---|---|---|---|
| Example 1 | 1100 | 35 | 1.26 | 3.6 | 0.37 | 2.8 |
| Comparative Example 1 | 1160 | 56 | 1.42 | 7.5 | 1.42 | 6.7 |
| Comparative Example 2 | 1160 | 129 | 1.92 | 11.2 | 1.75 | 8.7 |
| Example 2 | 1060 | 31 | 1.13 | 5.5 | 0.53 | 2.5 |
| Example 3 | 900 | 30 | 1.04 | 3.8 | 0.21 | 0.4 |
| Example 4 | 1090 | 32 | 1.18 | 3.3 | 0.2 | 2 |
| Comparative Example 3 | 1160 | 317 | 4.71 | 8.5 | 2 | 13.5 |
| Comparative Example 4 | 1160 | 62 | 1.57 | 7.6 | 1.42 | 7.2 |
| Example 5 | 1090 | 35 | 1.28 | 7.8 | 0.51 | 2.2 |
| Comparative Example 5 | 1160 | 224 | 3.4 | 8.1 | 2.1 | 10.1 |
| Example 6 | 1090 | 30 | 1.12 | 3.7 | 0.6 | 2.7 |
| Example 7 | 1060 | 30 | 1.11 | 3.5 | 0.41 | 2.4 |
| Comparative Example 6 | 1160 | 55 | 1.43 | 8.3 | 1.24 | 7.1 |
| Example 8 | 1060 | 32 | 1.18 | 3.6 | 0.21 | 2.2 |
| Comparative Example 7 | 1160 | 109 | 2.81 | 7.7 | 1.83 | 9.1 |
| Example 9 | 1090 | 33 | 1.21 | 3.6 | 0.47 | 2.6 |
| Comparative Example 8 | 1160 | 64 | 1.67 | 7.4 | 1.37 | 9.8 |
| Example 10 | 1090 | 31 | 1.13 | 3.4 | 0.52 | 2.6 |
| Comparative Example 9 | 1160 | 70 | 1.86 | 8.1 | 1.78 | 9.2 |
| Example 11 | 1090 | 33 | 1.2 | 3.5 | 0.45 | 2.3 |
| Comparative Example 10 | 1160 | 47 | 1.73 | 7.9 | 1.34 | 6.9 |
| Example 12 | 1090 | 32 | 1.18 | 3.6 | 0.39 | 2.1 |
| Comparative Example 11 | 1160 | 134 | 2.02 | 7.8 | 1.91 | 10.1 |
| Example 13 | 1060 | 32 | 1.15 | 6.1 | 0.74 | 2.4 |
| Comparative Example 12 | 1160 | 161 | 2.41 | 9.2 | 2.32 | 11.1 |
| Example 14 | 1090 | 40 | 1.20 | 3.2 | 0.52 | 2.6 |

The sputtering target for a magnetic recording film target of the present invention yields superior effects of being able to inhibit the generation of micro cracks in a target, inhibit the generation of particles during sputtering, and shorten the burn-in time. Since particles are less-frequently generated, a significant effect is yielded in that the percent defective of the magnetic recording film is reduced and cost reduction can be realized. Moreover, shortening of the burn-in time significantly contributes to the improvement of production efficiency.

Accordingly, the present invention is effective as a ferromagnetic sputtering target for use in forming a magnetic thin film of a magnetic recording medium, and particularly in forming a recording layer of a hard disk drive.

The invention claimed is:

1. A sputtering target for producing a magnetic recording film, wherein the target consists of greater than 0 mol % to no greater than 50 mol % of Cr, an amount of SiO$_2$ of greater than 0 mol % to no greater than 20 mol %, and Co, and a ratio of the peak intensity of cristobalites, which are crystallized SiO$_2$, to the background intensity (cristobalite peak intensity/background intensity) in an X-ray diffraction is 1.40 or less.

2. The sputtering target for producing a magnetic recording film according to claim 1, wherein a rate of change of the thermal expansion coefficient during temperature rising from 250° C. to 350° C. is 7% of less.

3. A sputtering target for producing a magnetic recording film, wherein the target contains greater than 0 mol % to no greater than 50 mol % of Cr, greater than 0 mol % to no greater than 50 mol % of Pt, an amount of SiO$_2$ of greater than 0 mol % to no greater than 5 mol %, and Co, and a ratio of the peak intensity of cristobalites, which are crystallized SiO$_2$, to the background intensity (cristobalite peak intensity/background intensity) in an X-ray diffraction is 1.40 or less.

4. A sputtering target for producing a magnetic recording film, wherein the target contains 5 mol % or more and 60 mol % or less of Pt, an amount of $SiO_2$ of greater than 0 mol % to 20 mol % or less, and Fe, and a ratio of the peak intensity of cristobalites, which are crystallized $SiO_2$, to the background intensity (cristobalite peak intensity/background intensity) in an X-ray diffraction is 1.40 or less.

5. The sputtering target for producing a magnetic recording film according to claim 3, wherein a rate of change of the thermal expansion coefficient during temperature rising from 250° C. to 350° C. is 7% of less.

6. The sputtering target for producing a magnetic recording film according to claim 5, wherein one or more elements selected from B, Ti, V, Mn, Zr, Nb, Ru, Mo, Ta, W, Au, Cu, and Ag is contained as an additive element in an amount of 0.01 mol % or more and 10 mol % or less.

7. The sputtering target for producing a magnetic recording film according to claim 6, wherein one or more inorganic materials selected from $TiO_2$, $Cr_2O_3$, $Ta_2O_5$, and CoO is contained as an additive material.

8. The sputtering target for producing a magnetic recording film according to claim 3, wherein one or more elements selected from B, Ti, V, Mn, Zr, Nb, Ru, Mo, Ta, W, Au, Cu, and Ag is contained as an additive element in an amount of 0.01 mol % or more and 10 mol % or less.

9. The sputtering target for producing a magnetic recording film according to claim 3, wherein one or more inorganic materials selected from $TiO_2$, $Cr_2O_3$, $Ta_2O_5$, and CoO is contained as an additive material.

10. The sputtering target for producing a magnetic recording film according to claim 4, wherein a rate of change of the thermal expansion coefficient during temperature rising from 250° C. to 350° C. is 7% of less.

11. The sputtering target for producing a magnetic recording film according to claim 4, wherein one or more elements selected from B, Ti, V, Mn, Zr, Nb, Ru, Mo, Ta, W, Au, Cu, and Ag is contained as an additive element in an amount of 0.01 mol % or more and 10 mol % or less.

12. The sputtering target for producing a magnetic recording film according to claim 4, wherein one or more inorganic materials selected from $TiO_2$, $Cr_2O_3$, $Ta_2O_5$, and CoO is contained as an additive material.

13. The sputtering target according to claim 4, wherein the sputtering target contains 2 to 20 mol % of $SiO_2$.

14. The sputtering target according to claim 1, wherein the sputtering target contains 2 to 20 mol % of $SiO_2$.

15. The sputtering target according to claim 3, wherein the sputtering target contains 2 to 5 mol % of $SiO_2$.

16. A method of producing a sputtering target for use in forming a magnetic recording film, comprising the steps of:
using amorphous $SiO_2$ as powder raw material of $SiO_2$,
mixing the powder raw material of $SiO_2$ and magnetic metal powder raw materials, and
subjecting a mixture of the powder raw material of $SiO_2$ and magnetic metal powder raw materials to sintering at a sintering temperature of 1120° C. or less,
wherein the sputtering target produced by the sintering (a) consists of greater than 0 mol % to no greater than 50 mol % of Cr, an amount of $SiO_2$ of greater than 0 mol % to no greater than 20 mol %, and Co; (b) contains greater than 0 mol % to no greater than 50 mol % of Cr, greater than 0 mol % to no greater than 50 mol % of Pt, an amount of $SiO_2$ of greater than 0 mol % to no greater than 5 mol %, and Co; or (c) contains 5 mol % or more and 60 mol % or less of Pt, an amount of $SiO_2$ of greater than 0 mol % to 20 mol % or less, and Fe, and
wherein the sputtering target has a ratio of the peak intensity of cristobalites, which are crystallized $SiO_2$, to the background intensity (cristobalite peak intensity/background intensity) in an X-ray diffraction of 1.40 or less.

* * * * *